United States Patent
Oriji et al.

(10) Patent No.: US 8,866,186 B2
(45) Date of Patent: Oct. 21, 2014

(54) GROUP III NITRIDE SEMICONDUCTOR LIGHT-EMITTING DEVICE

(75) Inventors: Gaku Oriji, Ichihara (JP); Koji Kamei, Ichihara (JP); Hisayuki Miki, Ichihara (JP); Akihiro Matsuse, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 1705 days.

(21) Appl. No.: 12/067,350

(22) PCT Filed: Sep. 20, 2006

(86) PCT No.: PCT/JP2006/319089
§ 371 (c)(1),
(2), (4) Date: Mar. 19, 2008

(87) PCT Pub. No.: WO2007/034971
PCT Pub. Date: Mar. 29, 2007

(65) Prior Publication Data
US 2010/0181595 A1    Jul. 22, 2010

Related U.S. Application Data

(60) Provisional application No. 60/720,649, filed on Sep. 27, 2005, provisional application No. 60/722,441, filed on Oct. 3, 2005.

(30) Foreign Application Priority Data

Sep. 20, 2005 (JP) .................................. 2005-271356
Sep. 21, 2005 (JP) .................................. 2005-273711

(51) Int. Cl.
*H01L 33/00* (2010.01)
*H01L 21/78* (2006.01)
*H01L 33/20* (2010.01)
*H01L 33/38* (2010.01)

(52) U.S. Cl.
CPC ................. *H01L 33/20* (2013.01); *H01L 33/38* (2013.01)
USPC ............ 257/103; 257/E21.599; 257/E33.023; 257/E33.067; 438/33

(58) Field of Classification Search
CPC ............................... H01L 33/20; H01L 33/38
USPC ........... 257/103, E21.599, E33.023, E33.067; 438/33
See application file for complete search history.

(56) References Cited

U.S. PATENT DOCUMENTS 4,160,988 A * 7/1979 Russell ........................ 257/474
5,260,588 A * 11/1993 Ohta et al. ..................... 257/93

(Continued)

FOREIGN PATENT DOCUMENTS

CN    1441971 A    9/2003
EP    1553640 A1   7/2005

(Continued)

OTHER PUBLICATIONS

Supplementary European Search Report for EP 06 79 8347 dated Feb. 24, 2012.

*Primary Examiner* — Hrayr A Sayadian
(74) *Attorney, Agent, or Firm* — Sughrue Mion, PLLC

(57) ABSTRACT

The present invention aims to enhance the light extraction efficiency of the Group III nitride semiconductor light-emitting device.
The inventive Group III nitride semiconductor light-emitting device comprises a substrate; and a Group III nitride semiconductor layer including a light-emitting layer, stacked on the substrate, wherein the side face of the Group III nitride semiconductor layer is tilted with respect to the normal line of the major surface of the substrate.

25 Claims, 8 Drawing Sheets

(56) References Cited

U.S. PATENT DOCUMENTS

| | | |
|---|---|---|
| 6,121,636 A | 9/2000 | Morita et al. |
| 6,650,018 B1 * | 11/2003 | Zhao et al. ............ 257/775 |
| 7,042,150 B2 * | 5/2006 | Yasuda ............ 313/498 |
| 2001/0000209 A1 | 4/2001 | Krames et al. |
| 2003/0107053 A1 * | 6/2003 | Uemura et al. ............ 257/200 |
| 2004/0004226 A1 * | 1/2004 | Eisert et al. ............ 257/95 |
| 2005/0025204 A1 * | 2/2005 | Kamikawa et al. ............ 372/43 |
| 2005/0179042 A1 | 8/2005 | Yang et al. |
| 2006/0171081 A1 * | 8/2006 | Breuer et al. ............ 360/313 |
| 2006/0172513 A1 * | 8/2006 | Yanashima et al. ............ 438/483 |
| 2006/0192223 A1 * | 8/2006 | Lee et al. ............ 257/99 |

FOREIGN PATENT DOCUMENTS

| | | |
|---|---|---|
| EP | 1 672 704 A2 | 6/2006 |
| JP | 4-343484 A | 11/1992 |
| JP | 2001-284650 A | 10/2001 |
| JP | 2003-347589 A | 12/2003 |

* cited by examiner

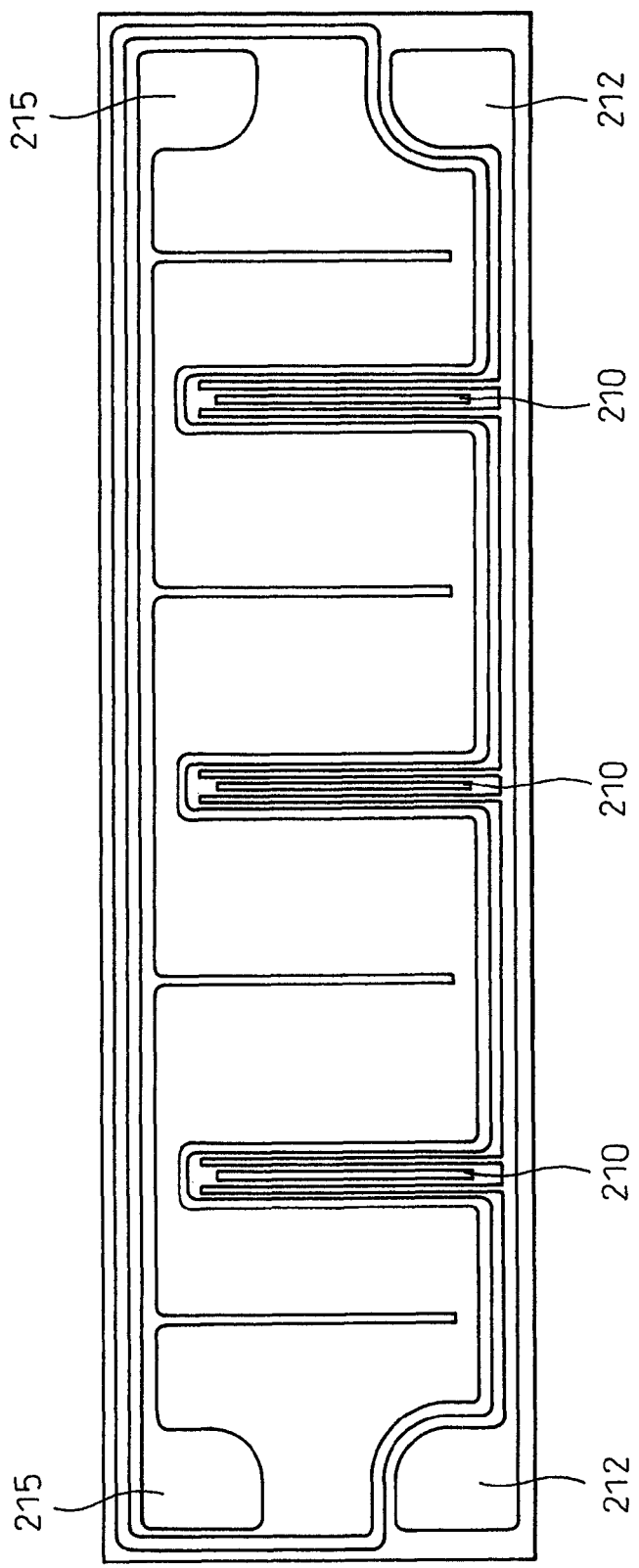

GROUP III NITRIDE SEMICONDUCTOR LIGHT-EMITTING DEVICE

CROSS REFERENCE TO RELATED APPLICATIONS

This application is an application filed under 35 U.S.C. §111(a) claiming benefit, pursuant to 35 U.S.C. §119(e)(1), of the filing date of the Provisional Application No. 60/720,649 filed on Sep. 27, 2005 and of the Provisional Application No. 60/722,441 filed on Oct. 3, 2005, pursuant to 35 U.S.C. §111(b).

TECHNICAL FIELD

The present invention relates to a Group III nitride semiconductor light-emitting device and, more particularly, to a Group III nitride semiconductor light-emitting device having enhanced light extraction efficiency.

BACKGROUND ART

As a Group III nitride semiconductor (hereinafter referred to as a nitride semiconductor) has an energy band gap, of a direct transition type, corresponding to visible light to ultraviolet light and can emit light with high efficiency, it is used in products such as light-emitting diodes (LEDs), laser diodes (LDs), or the like. The realization of a white light-emitting diode, where the diode is used in combination with a phosphor, is expected to be a new field of the application of light-emitting diodes.

The output from a light-emitting diode is determined by a product of an internal quantum efficiency, which relates to epitaxial structure and crystallinity, and light extraction efficiency, which relates to resorption in the device and the shape of the device. Among these, resorption in the device, that affects the light extraction efficiency, occurs when light passes through a non-transparent substrate or passes again through the light-emitting layer. As one cause having a great influence on the light extraction efficiency is total reflection at the surface of the device. As is well known, when light is directed toward a layer having a small refractive index from a layer having a great refractive index, light with an angle greater than a critical angle (θc) produces a total reflection at the interface, so that it cannot pass to the layer having a small refractive index.

In the case of gallium nitride (GaN), for example, the refractive index is 2.4, and only light in the Escape Cone, having an apex angle of 24 degrees with respect to the direction vertical to the surface, can be extracted to the outside. The ratio of this is 27%, and this greatly restricts the light extraction efficiency.

In order to avoid restriction of the light extraction at the interface caused by total reflection, there has been known a method for roughening the interface (e.g., see Japanese Unexamined Patent Publication No. 2000-196152) or a method for utilizing an Escape Cone of another surface by processing the shape of the device (e.g., see Japanese Patent No. 2784537).

MOCVD (metal organic chemical vapor deposition) is frequently used for the growth of a nitride semiconductor. MOCVD is a method in which an organic metal and a nitrogen source are reacted on a substrate to grow the nitride semiconductor. However, a single crystal of the nitride semiconductor has not yet been obtained, industrially. Further, although a dummy single crystal substrate, in which a thick-film epitaxial growth is performed on a Si or GaAs substrate with an HVPE (hydride vapor deposition epitaxial method), is commercially available, this dummy single crystal substrate is very expensive. Therefore, a dissimilar substrate such as sapphire ($Al_2O_3$), silicon carbide (SiC), or silicon (Si), that is stable at high temperature, is generally used as a substrate for a light-emitting diode.

However, the sapphire or SiC that is a stable material is well known as a material that is hard and difficult to process. Therefore, there is a problem that it is difficult to divide the material to fabricate each device in order to enhance the light extraction efficiency. In the case of a mechanical method by a dicing, a device is frequently broken or cracked, and hence, it is difficult to enhance a yield. Even by means such as a dry etching, that does not use a mechanical method, it takes long time to process, whereby there arises a problem of a remarkably low productivity.

Further, it has been well known that, with the mechanical processing method by a dicing, a layer called a broken layer is formed on the processed surface, which hinders light extraction, and the electric characteristics and optical characteristics are affected by the exposure to high energy particles of plasma even in dry etching.

Wet etching has been known as a processing method causing less damage (e.g., see Japanese Unexamined Patent Publications No. 10-190152 and No. 2000-686084), but the divided cutting surface of each device is vertical to the major surface of the substrate.

Meanwhile, a transparent electrode is used, in most cases, in a light-emitting device made of a nitride semiconductor (e.g., see Japanese Unexamined Patent Publication No. 10-308534). This is because the current diffusion in the lateral direction in a p-type layer is poor compared to an n-type layer.

A comb-shaped electrode, in which negative electrodes and positive electrodes are alternately arranged, may be used for a large chip whose one side is 500 μm or more (e.g., see Japanese Unexamined Patent Publication No. 5-335622). Further, a grid pattern or dot pattern can be employed. A technique for fabricating a positive electrode of a comb-shaped pattern with a transparent material has been disclosed (e.g., see Japanese Unexamined Patent Publication No. 2003-133589).

DISCLOSURE OF INVENTION

In view of the aforesaid reduction in the light extraction efficiency due to the total reflection of light in the nitride semiconductor light-emitting device, the present invention aims to enhance the light extraction efficiency of the nitride semiconductor light-emitting device.

The present invention further aims to achieve the effect not only in the case of using a transparent electrode formed generally all over a semiconductor layer but also even in the case of using a comb-shaped electrode, grid electrode or dot electrode.

The present invention is accomplished based upon the fact that a tilted side face with respect to a substrate of a nitride semiconductor layer, constituting a nitride semiconductor light-emitting device, can lead to a light-emitting device having excellent light extraction efficiency.

Further, the present invention is accomplished based upon the fact that a light-emitting device having excellent light extraction efficiency can be obtained by forming a groove, whose side face is tilted with respect to a substrate and which is formed for enhancing the light extraction efficiency, at the region of the light-emitting device other than electrodes.

Further, the present invention uses wet etching as a processing method, and when the side face of a semiconductor layer of a nitride semiconductor device is tilted, it is found that the distribution of a dislocation density in the semiconductor layer and a removing speed of the semiconductor layer by the wet etching are correlated with each other such that the higher the dislocation density is, the faster the removing speed is. It is possible, by using this finding, to form the tilted face on the semiconductor layer without giving damage, and further, the tilt angle can be controlled by varying the distribution of the dislocation density, whereby the present invention enhances the light extraction efficiency by optimizing this angle.

Specifically, the present invention comprises the inventions of the following items.

(1) A nitride semiconductor light-emitting device comprising a substrate; and a nitride semiconductor layer including a light-emitting layer, stacked on the substrate, wherein the side face of the nitride semiconductor layer is tilted with respect to the normal line of the major surface of the substrate.

(2) A nitride semiconductor light-emitting device according to (1), wherein a groove is formed on the nitride semiconductor layer at the region of the surface of the light-emitting device where an electrode is not formed, and the normal line of the side face of the groove is not vertical to the normal line of the major surface of the substrate.

(3) A nitride semiconductor light-emitting device according to (1) or (2), wherein the cross-section of the nitride semiconductor layer is tilted so as to be narrower toward the substrate.

(4) A nitride semiconductor light-emitting device according to (3), wherein the angle $\theta 1$ made by the normal line of the side face of the nitride semiconductor layer and the normal line of the major surface of the substrate is 100 degrees or more and 175 degrees or less.

(5) A nitride semiconductor light-emitting device according to (4), wherein the angle $\theta 1$ made by the normal line of the side face of the nitride semiconductor layer and the normal line of the major surface of the substrate is 110 degrees or more and 170 degrees or less.

(6) A nitride semiconductor light-emitting device according to (5), wherein the angle $\theta 1$ made by the normal line of the side face of the nitride semiconductor layer and the normal line of the major surface of the substrate is 120 degrees or more and 160 degrees or less.

(7) A nitride semiconductor light-emitting device according to any one of (3) to (6), wherein the dislocation density in the nitride semiconductor layer decreases from the substrate toward the growing direction of the semiconductor layer.

(8) A nitride semiconductor light-emitting device according to (7), wherein the dislocation density in the nitride semiconductor layer decreases from the substrate toward the growing direction of the semiconductor layer at a ratio of 10 $cm^{-2}$ to 10000 $cm^{-2}$ per a thickness of 1.0 μm in the direction vertical to the substrate.

(9) A nitride semiconductor light-emitting device according to (8), wherein the dislocation density in the nitride semiconductor layer decreases from the substrate toward the growing direction of the semiconductor layer at a ratio of 100 $cm^{-2}$ to 1000 $cm^{-2}$ per a thickness of 1.0 μm in the direction vertical to the substrate.

(10) A nitride semiconductor light-emitting device according to (1) or (2), wherein the cross-section of the nitride semiconductor layer is tilted so as to be wider toward the substrate.

(11) A nitride semiconductor light-emitting device according to (10), wherein the angle $\theta 2$ made by the normal line of the side face of the nitride semiconductor layer and the normal line of the major surface of the substrate is 5 degrees or more and 80 degrees or less.

(12) A nitride semiconductor light-emitting device according to (11), wherein the angle $\theta 2$ made by the normal line of the side face of the nitride semiconductor layer and the normal line of the major surface of the substrate is 10 degrees or more and 70 degrees or less.

(13) A nitride semiconductor light-emitting device according to (12), wherein the angle $\theta 2$ made by the normal line of the side face of the nitride semiconductor layer and the normal line of the major surface of the substrate is 20 degrees or more and 60 degrees or less.

(14) A nitride semiconductor light-emitting device according to any one of (10) to (13), wherein the dislocation density in the nitride semiconductor layer increases from the substrate toward the growing direction of the semiconductor layer.

(15) A nitride semiconductor light-emitting device according to (14), wherein the dislocation density in the nitride semiconductor layer increases from the substrate toward the growing direction of the semiconductor layer at a ratio of 10 $cm^{-2}$ to 10000 $cm^{-2}$ per a thickness of 1.0 μm in the direction vertical to the substrate.

(16) A nitride semiconductor light-emitting device according to (15), wherein the dislocation density in the nitride semiconductor layer increases from the substrate toward the growing direction of the semiconductor layer at a ratio of 100 $cm^{-2}$ to 1000 $cm^{-2}$ per a thickness of 1.0 μm in the direction vertical to the substrate.

(17) A nitride semiconductor light-emitting device according to any one of (2) to (16), wherein the groove is formed at two or more positions.

(18) A nitride semiconductor light-emitting device according to any one of (2) to (17), wherein the groove has a depth piercing through the light-emitting layer.

(19) A nitride semiconductor light-emitting device according to any one of (2) to (18), wherein the area of the groove at the surface is 3 to 50% of the surface area of the light-emitting device including the electrode surface.

(20) A nitride semiconductor light-emitting device according to any one of (2) to (19), wherein electrodes having the same polarity are formed across the groove.

(21) A nitride semiconductor light-emitting device according to any one of (2) to (20), wherein an electrode is formed at the outside of the electrodes having the same polarity and formed across the groove, wherein the electrode is of a polarity opposite to the polarity of the electrode closer to the groove.

(22) A nitride semiconductor light-emitting device according to any one of (1) to (21), wherein the length of one side of the light-emitting device at the surface is 500 μm or more.

(23) A nitride semiconductor light-emitting device according to any one of (1) to (22), wherein the substrate is made of sapphire ($Al_2O_3$).

(24) A nitride semiconductor light-emitting device according to any one of (1) to (22), wherein the substrate is made of silicon carbide (SiC).

(25) A nitride semiconductor light-emitting device according to any one of (1) to (22), wherein the substrate is made of silicon (Si).

(26) A method of fabricating a nitride semiconductor light-emitting device comprising a substrate and a nitride semiconductor layer including a light-emitting layer, stacked on the substrate, comprising: a step of stacking the nitride semiconductor layer on the substrate; a step of covering the surface of the nitride semiconductor layer with a mask having a predetermined pattern; a step of removing the nitride semiconductor layer to the substrate at the section for dividing into each device; a step of wet-etching the nitride semiconductor layer after the removal; and a step of dividing into devices, wherein, in the step of stacking the nitride semiconductor layer, a distribution of dislocation density is formed in the nitride semiconductor layer in the direction vertical to the substrate so as to provide a distribution in the etching speed in the later-performed wet-etching process.

(27) A method of fabricating a nitride semiconductor light-emitting device according to (26), wherein, in the step of stacking the nitride semiconductor layer, the dislocation density is decreased or increased from the substrate toward the growing direction of the semiconductor layer.

(28) A method of fabricating a nitride semiconductor light-emitting device according to (26) or (27), wherein the mask is a photoresist.

(29) A method of fabricating a nitride semiconductor light-emitting device according to any one of (26) to (28), wherein the step of removing the nitride semiconductor layer is performed with the use of a laser.

(30) A method of fabricating a nitride semiconductor light-emitting device according to any one of (26) to (28), wherein the step of removing the nitride semiconductor layer is performed with the use of a dicer.

(31) A method of fabricating a nitride semiconductor light-emitting device according to any one of (26) to (30), wherein the wet-etching process is performed with the use of orthophosphoric acid.

According to the present invention, the side face of the semiconductor layer of the nitride semiconductor light-emitting device is tilted, whereby light, which is transmitted through the side face or is reflected at the side face and extracted to the outside through the nitride semiconductor layer, increases. Therefore, a light extraction efficiency is enhanced.

Further, a groove is formed at the surface of the nitride semiconductor light-emitting device according to the present invention. The side face of the groove is tilted, whereby light, which is transmitted through the side face or is reflected at the side face and extracted to the outside through the nitride semiconductor layer, increases. Therefore, a light extraction efficiency is enhanced. In this case, an electrode is not formed around the groove. Therefore, a short circuit caused by the exposure of the side face of the pn junction can be prevented. Further, the electrodes having the same polarity are formed at both sides of the groove, so that uniform light emission can be obtained in a large area without hindering the spread of the current by the groove.

Moreover, according to the present invention, the distribution of the dislocation density in the nitride semiconductor layer in the direction vertical to the substrate in the nitride semiconductor light-emitting device is controlled, whereby the angle of the tilted face with respect to the substrate can be controlled. Therefore, the light extraction efficiency can easily be optimized. Further, the processing of the side face of the nitride semiconductor layer formed on a hard-to-process substrate is performed by a wet etching, whereby a light-emitting device having less damage can be obtained.

BRIEF DESCRIPTION OF DRAWINGS

FIG. 12 is a schematic plan view of the nitride semiconductor light-emitting device manufactured in example 9.

BEST MODE FOR CARRYING OUT THE INVENTION

The present invention is characterized in that, in a nitride semiconductor light-emitting device including a light-emitting layer stacked on a substrate, a side face of a nitride semiconductor layer is tilted (the normal line of the side face of the nitride semiconductor layer is not vertical to the normal line of the major surface of the substrate).

The present invention will be specifically explained with reference to the drawings.

Figure 1:
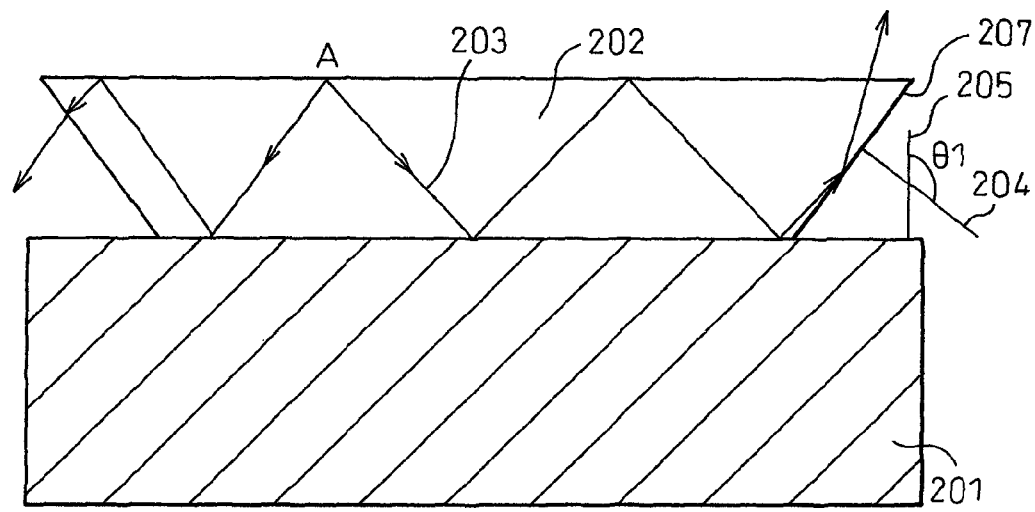
FIG. 1 is a sectional view schematically showing one example of a path of light in a nitride semiconductor light-emitting device according to the present invention.
Figure 2:
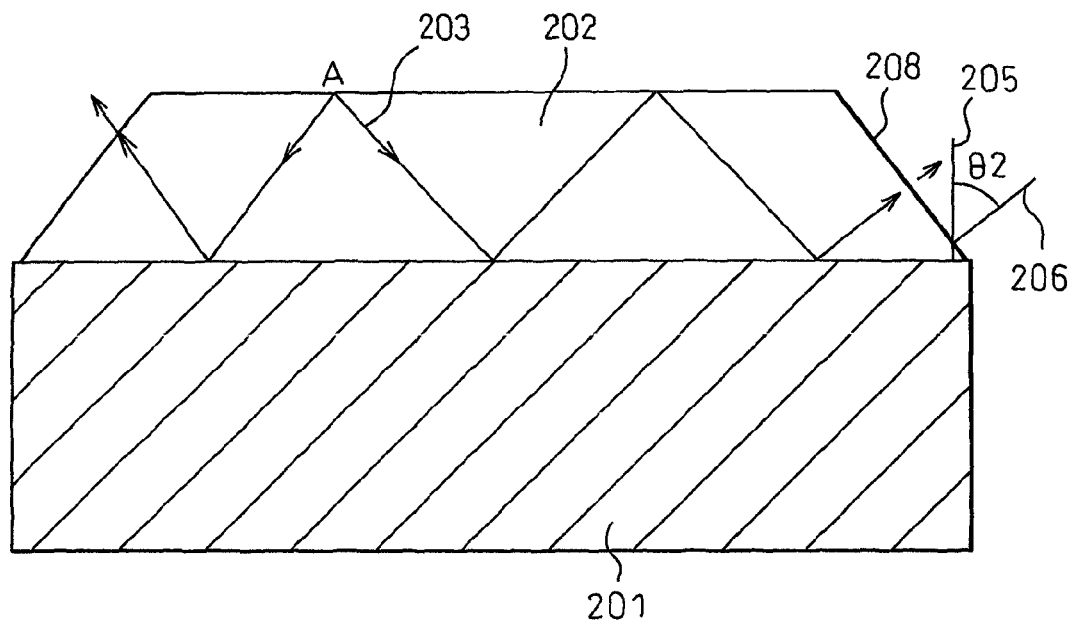
FIG. 2 is a sectional view schematically showing one example of a path of light in nitride semiconductor light-emitting device according to another embodiment of the present invention.
Figure 3:
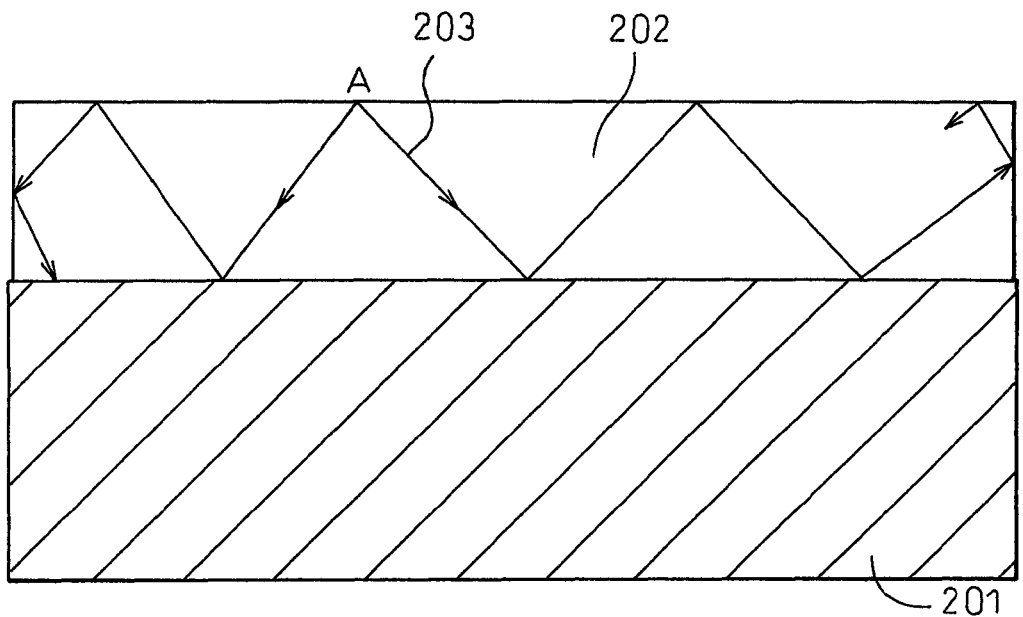
FIG. 3 is a sectional view schematically showing one example of a path of light in a conventional nitride semiconductor light-emitting device.

FIG. 1 is a sectional view schematically showing one example of a path of light in a nitride semiconductor light-emitting device, according to the present invention, wherein the side face of the nitride semiconductor layer is tilted outward with respect to the major surface of the substrate (the cross-sectional shape of the nitride semiconductor layer is tilted so as to be narrower toward the substrate). FIG. 2 is a sectional view schematically showing one example of a path of light in a nitride semiconductor light-emitting device according to another embodiment of the present invention, wherein the side face of the nitride semiconductor layer is tilted inward with respect to the major surface of the substrate (the cross-sectional shape of the nitride semiconductor layer is tilted so as to be wider toward the substrate). FIG. 3 is a sectional view schematically showing one example of a path of light in a conventional nitride semiconductor light-emitting device, wherein the side face of the nitride semiconductor layer is vertical to the major surface of the substrate.

In these figures, numeral 201 denotes a substrate, 202 denotes a nitride semiconductor layer, 203 denotes an advancing line of light, 204 denotes a normal line of a side face 207 of the nitride semiconductor layer, 205 denotes a normal line of a major surface of the substrate, and 206 denotes a normal line of a side face 208 of the nitride semiconductor layer. The angle θ1 in FIG. 1 is the angle (tilt angle) made by the normal lines 204 and 205, and the angle θ2 in FIG. 2 is the angle (tilt angle) made by the normal lines 206 and 205.

The reason why a light extraction efficiency is enhanced based on the side face of the nitride semiconductor layer tilted with respect to the major surface of the substrate is not clear, but it is considered to be as follows.

FIG. 3 shows a conventional nitride semiconductor light-emitting device. When light emitted at a point A advances in the direction of an arrow, for example, light incident on the side face of the semiconductor layer is reflected at this point and further reflected at the interface between the semiconductor layer and the substrate, if it has an angle more than a critical angle. As a result, light advances in the semiconductor layer with the repeated reflection, is absorbed, and then, decays. Consequently, the light extraction efficiency is reduced.

On the other hand, in the nitride semiconductor light-emitting device shown in FIG. 1, light from the point A is reflected on the side face 207 of the semiconductor layer. However, the light takes an angle within the critical angle on the surface of the semiconductor layer, whereby the total reflection of light is suppressed, and hence, light can be extracted from the semiconductor layer. In FIG. 1, the tilt angle $\theta 1$ is smaller than 180 degrees but greater than 90 degrees. Preferably, the angle $\theta 1$ is 100 degrees or more and 175 degrees or less, more preferably, it is 110 degrees or more and 170 degrees or less, and most preferably, it is 120 degrees or more and 160 degrees or less.

In the case of FIG. 2, as the incident light takes an angle within the critical angle on the side face of the nitride semiconductor layer, light is transmitted through the semiconductor layer. The tilt angle $\theta 2$ is preferably 5 to 80 degrees, more preferably 10 to 70 degrees, and most preferably 20 to 60 degrees.

From the above, the light extraction efficiency can be enhanced in either case of FIG. 1 and FIG. 2. It is preferable that the cross-sectional shape of the nitride semiconductor layer is tilted so as to be narrower toward the substrate as shown in FIG. 1.

The nitride semiconductor light-emitting device of the present invention may have a groove formed on the surface of the nitride semiconductor layer where the electrode is not formed on the surface of the light-emitting device, wherein the side face of the groove may not be vertical to the major surface of the substrate but tilted. The formation of the groove described above provides the side face of the nitride semiconductor layer that is tilted with respect to the normal line of the major surface of the substrate.

Figure 4:
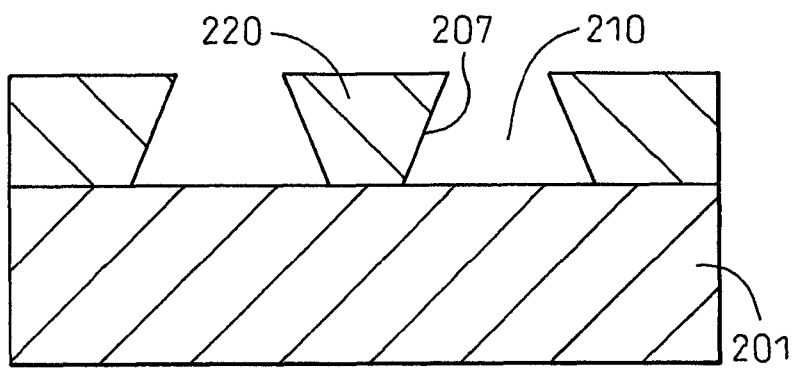
FIG. 4 is a sectional view showing a shape of a groove on the surface of the nitride semiconductor light-emitting device according to the present invention.

FIG. 4 is a sectional view showing one shape of the groove of the light-emitting device. The side face of the groove in this figure is tilted so that the cross-sectional shape of the groove becomes wider toward the substrate (in the downward direction in the figure) (the cross-sectional shape of the nitride semiconductor layer becomes narrower toward the substrate). In FIG. 4, numeral 210 denotes a groove, and 220 denotes a nitride semiconductor layer. Numeral 201 denotes a substrate. The nitride semiconductor layer 220 has the shape same as that of the nitride semiconductor layer 202 in FIG. 1, and the light extraction efficiency is enhanced for the same reason as that of FIG. 1.

Figure 5:
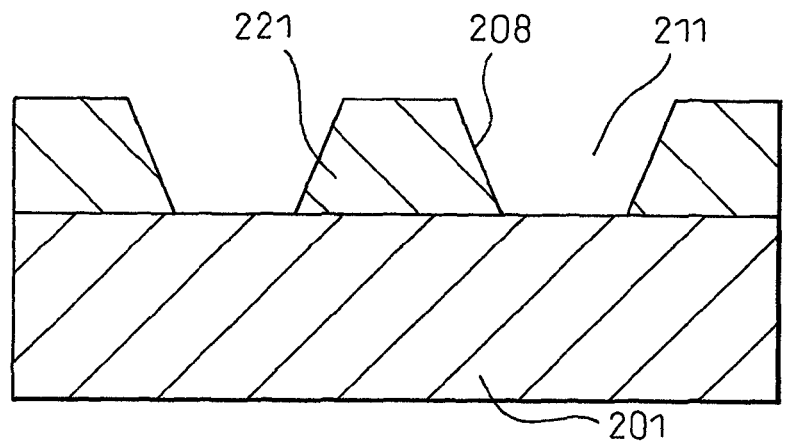
FIG. 5 is a sectional view showing another shape of a groove on the surface of the nitride semiconductor light-emitting device according to the present invention.

FIG. 5 shows another shape of a groove, wherein the side face of the groove is tilted so that the cross-sectional shape of the groove becomes narrower toward the substrate (the cross-sectional shape of the nitride semiconductor layer becomes wider toward the substrate). In FIG. 5, numeral 211 denotes a groove, and 221 denotes a nitride semiconductor layer. Numeral 201 denotes a substrate. The nitride semiconductor layer 221 has the shape same as that of the nitride semiconductor layer 202 in FIG. 2, and the light extraction efficiency is enhanced for the same reason as that of FIG. 2.

The groove formed in the present invention is desirably formed to have a depth piercing through the light-emitting layer of the semiconductor layer. As a p-type layer is formed to be relatively thin in most cases, such as 0.1 µm to 1 µm, in the light-emitting device using a nitride semiconductor, the groove is formed so as to pierce through the light-emitting layer to provide a deep groove in order to sufficiently achieve the light extraction effect.

However, when a conductive material is adhered onto the exposed pn junction, a short circuit is caused. An electrode material has the highest possibility of causing the short circuit. An electrode material is conductive, and it is possible that broken pieces of the electrode material are adhered. Further, it is possible that an electrode sticking out as a burr causes a short circuit at the pn junction.

In view of this, it is desirable that the groove is formed at the region where the electrode is not formed. Accordingly, the short circuit due to the electrode material can be prevented.

When a groove is formed on a surface of a light-emitting device, a p-type layer and an n-type layer are divided into some sections by the groove. As a result, a current diffusion in a plane direction is prevented and it is feared that a driving voltage is increased. In order to avoid such fear, as for an electrode pattern, a comb-shaped type, in which negative electrodes and positive electrodes are alternately arranged, can be employed. The employment of the comb-shaped electrode can provide a satisfactory current diffusion, and can reduce the drive voltage to afford a uniform light emission. Further, the groove can be formed between electrodes. This arrangement does not hinder the current supply and, thus, is preferable. The comb-shaped electrode is effective to supply a current sufficiently to a transparent positive electrode and therefore it is also preferable to provide a comb-shaped positive electrode pad in addition to a comb-shaped negative electrode. Even in case where the comb-shaped electrode pattern is employed, one of the positive electrode and the negative electrode, or both electrodes, can be made transparent.

Besides, a grid electrode in which either one of a negative electrode and a positive electrode is arranged in a grid may be employed. The electrode that is not arranged in a grid may be arranged around the grid region, or arranged at the gap between grids, but it is convenient to arrange the electrode around the grid region. In this case, a dot or a circular groove can be formed at the portion corresponding to the gap between grids.

It is desirable that the electrodes having the same polarity are arranged across the groove. Considering the light extraction efficiency, the groove is desirably formed so as to be deep. In this case, when the electrodes having different polarity are arranged across the groove, the groove hinders the current flowing between the electrodes, so that the current flow is deteriorated to hinder the uniform light emission.

As the light extraction is improved by the light-emitting region close to the groove, in particular, the positive electrode is desirably arranged around the groove.

The groove processing according to the present invention can provide an effect of reducing the drive voltage and the effect of increasing the light-emitting output, when it is applied to a large chip having one side of 500 µm or more. The problem of small current diffusion occurs in the n-type layer. This is not remarkable on a small-sized chip, but the problem of current diffusion in the n-type layer becomes remarkable in a large-sized chip. Particularly, it is remarkable in a chip having one side of 500 µm or more.

In this case, a reduction in the drive voltage can be realized by employing a comb-shaped electrode or grid electrode.

Therefore, the light extraction efficiency can be increased by combining the groove processing of the present invention.

Special limitations are not imposed on the shape of the groove. Usable grooves include dot-like one such as a square shape or a circular shape, rectangular one, elongated slit-like one, and the like.

It is needless to say that the groove is formed at plural portions. As the density of the grooves increases, the light extraction effect can be increased. However, the formation of many grooves, occupying an area of the electrode, may reduce the light emission.

The total area of the grooves (the total of the area on the surface of the layer) is preferably 3 to 50% of the surface area of the semiconductor layer including the electrode.

The groove can be formed by a wet etching using an acid or an alkali, laser scribing, dicing, or the like. In order to form the groove into the shape shown in FIG. 4, for example, a groove is formed by a laser scribing, and then, a condition is employed in which the groove is treated at high temperature such as 300° C. with a wet etching method using phosphoric acid, while in order to form the groove into the shape shown in FIG. 5, a dicing method using an angular rotating blade can be used, for example.

In order to form the above-mentioned side face of the nitride semiconductor layer having the tilt angle, it is preferable that a nitride semiconductor layer whose dislocation density is controlled is formed, and this layer is processed by etching to vary the angle of the side face of the nitride semiconductor layer.

Figure 6:
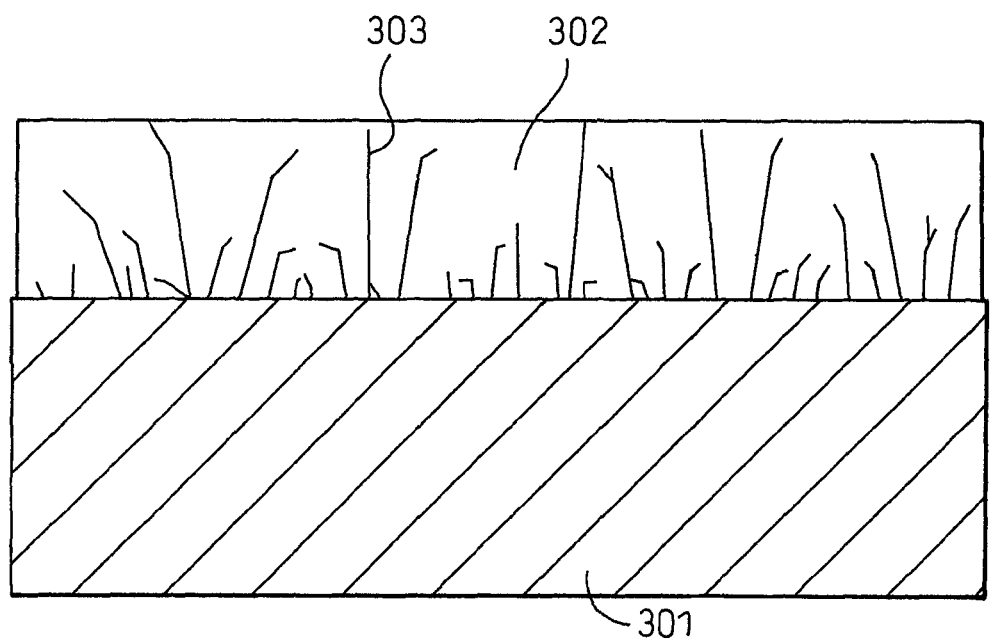
FIG. 6 is a schematic view showing a distribution of a dislocation in a general nitride semiconductor.

As shown in FIG. 6, many dislocations are generally present in the nitride semiconductor layer. In the figure, numeral 301 denotes a substrate, 302 denotes a nitride semiconductor layer, and 303 denotes a dislocation. The angle θ1 or θ2 representing the degree of the above-mentioned desirable tilt can be realized with satisfactory control by decreasing or increasing the dislocation density in the nitride semiconductor layer from the substrate toward the growing direction of the semiconductor layer in the direction vertical to the substrate with a ratio of 10 cm$^{-2}$ or more to 10,000 cm$^{-2}$ or less per thickness of 1.0 μm.

Preferably, it can be realized by decreasing or increasing the dislocation density in the nitride semiconductor layer from the substrate toward the growing direction of the semiconductor layer in the direction vertical to the substrate with a ratio of 100 cm$^{-2}$ or more to 1,000 cm$^{-2}$ or less per thickness of 1.0 μm.

In case where the dislocation density of the semiconductor layer decreases toward the growing direction of the semiconductor, the side face having the shape shown in FIG. 4 can be formed by etching the semiconductor layer because the etching speed becomes faster as the dislocation density becomes greater. When the dislocation density increases toward the growing direction of the semiconductor, the side face having the shape shown in FIG. 5 is formed. In these cases, the tilt angle can be controlled by varying the degree of the increase or decrease in the dislocation density.

The dislocation density present in the nitride semiconductor can be changed in the direction vertical to the substrate by changing various conditions upon the growing of the nitride semiconductor such as the growing temperature, growing speed, growing pressure, ratio of supply amount of material, or the like. Further, the dislocation density present in the nitride semiconductor can also be changed in the direction vertical to the substrate by a property of the substrate such as a concave/convex shape formed on the substrate. Similarly, the dislocation density present in the nitride semiconductor can be changed in a direction vertical to the substrate by forming a stripe-shaped mask made of, for example, SiO$_2$ on the substrate or nitride semiconductor layer for controlling the growing speed of the nitride semiconductor in the lateral direction during growth.

Moreover, the dislocation density present in the nitride semiconductor can be changed in the direction vertical to the substrate by covering the substrate or nitride semiconductor with an anti-surfactant such as, for example, Si atoms and controlling its coverage. Further, the dislocation density present in the nitride semiconductor can be changed in the direction vertical to the substrate by inserting plural buffer layers into the nitride semiconductor layer and by controlling its thickness, composition or growing temperature.

The dislocation density can be increased or decreased toward the growing direction by changing various growing conditions such as the growing temperature, growing speed, growing pressure, ratio of supplied amount of materials, or the like.

The dislocation density present in the nitride semiconductor layer can be controlled at will by controlling the various growing conditions of the nitride semiconductor layer at will as described above. The use of the aforesaid technique makes it possible to change the rate of change of the dislocation density from the substrate surface along the glowing direction at will, whereby the dislocation density can be decreased or increased from the substrate surface along the growing direction of the nitride semiconductor layer. As described later, the etching rate in the plane direction becomes high if the dislocation density is high, while the etching rate in the plane direction becomes low if the dislocation density is low. Therefore, the application of the present invention makes it possible to make the side face of the nitride semiconductor layer to tilt in such a manner that the center thereof expands outward by decreasing the dislocation density in the nitride semiconductor layer along the growing direction and then increasing the same, or to form the side face of the nitride semiconductor layer to tilt in such a manner that the center thereof is recessed inward by increasing the dislocation density in the nitride semiconductor layer along the growing direction and then decreasing the same in contrast with the aforesaid case. Further, it is needless to say that the side face of the nitride semiconductor can be formed to have plural uneven slopes by repeatedly performing the foregoing technique.

A large number of nitride semiconductors expressed by the formula Al$_X$Ga$_Y$In$_Z$In$_Z$N$_{1-A}$M$_A$ (0≤X≤1, 0≤Y≤1, 0≤Z≤1 and X+Y+Z=1; M represents a Group V element different from nitrogen (N) and 0≤A<1) are known as the nitride semiconductors, and the nitride semiconductors inclusive of these known semiconductors and expressed by the formula Al$_X$Ga$_Y$In$_Z$N$_{1-A}$M$_A$ (0≤X≤1, 0≤Y≤1, 0≤Z≤1 and X+Y+Z=1; N represents a Group V element different from nitrogen (N) and 0≤A<1) can be used without any limitation in the invention.

Known materials such as oxide single-crystal-like sapphire single crystal (Al$_2$O$_3$; A-surface, C-surface, M-surface, R-surface), spinel single crystal (MgAl$_2$O$_4$), or the like, SiC single crystal, Si, or the like can be used for the substrate of the nitride semiconductor light-emitting device according to the present invention without imposing any limitations. Among these, sapphire single crystal or SiC single crystal is preferable. It is to be noted that the plane direction of the substrate is not particularly limited. Further, the crystal plane of the substrate may be inclined toward a specific crystal plane or may not be inclined.

In order to stack the nitride semiconductor layer on the aforesaid substrate, a low-temperature buffer method disclosed in the Japanese Patent No. 3026087 and Japanese Unexamined Patent Publication No. 4-297023 or a lattice mismatch crystal epitaxial growing technique, called a Seeding Process (SP) method, disclosed in the Japanese Unexamined Patent Publication No. 2003-243302 can be used.

When a lattice mismatch crystal epitaxial growing technique such as a low-temperature buffer method or an SP method is used, the Group III nitride semiconductor serving as a base stacked on the substrate is desirably non-doped or slightly-doped GaN of about $5 \times 10^{17}$ cm$^{-3}$. It is preferable that the thickness of the base layer is 1 to 20 µm, and more preferably 5 to 15 µm.

An n-type GaN contact layer that is brought into contact with the electrode and serves to supply current is grown on the base layer. The n-type GaN contact layer is grown while supplying an n-type dopant at $1 \times 10^{18}$ cm$^{-3}$ to $1 \times 10^{18}$ cm$^{-3}$. As the n-type dopant, Si or Ge is generally selected. The doping may be performed uniformly or the doping may be performed such that a slightly-doped layer and a highly-doped layer are periodically repeated. The latter intermittent doping is particularly effective for suppressing pits generated during the growth of the crystal.

It is preferable that an n-type clad layer is provided between the n-type contact layer and the light-emitting layer. The n-type clad layer can be made of AlGaN, GaN, InGaN, or the like. When InGaN is used, it is needless to say that the n-type clad layer desirably has a composition greater than the band gap of InGaN serving as an light-emitting layer. The carrier concentration of the n-type clad layer may be the same as that of the n-type contact layer or may be greater or smaller.

A quantum well structure is preferably employed as the light-emitting layer on the n-type clad layer. It may be a single quantum well structure having only one well layer or a multiple quantum well structure having plural well layers. Of these, the multiple quantum well structure can provide a high output and reduced drive voltage, whereby it is preferable for the structure of the device using Group III nitride semiconductor. It is to be noted that, in the case of the multiple quantum well structure, the complete well layer (active layer) and barrier layer is collectively referred to as a light-emitting layer in this specification.

A p-type layer generally has a thickness of 0.01 to 1 µm and is composed of a p-type clad layer that is brought into contact with the light-emitting layer and a p-type contact layer for forming a positive electrode. The p-type clad layer can also serve as the p-contact layer. The p-type clad layer is formed with the use of GaN, AlGaN, or the like, and Mg is doped thereto as a p-type dopant.

Known negative electrodes having various compositions and structures can be used as a negative electrode without imposing any limitation. As a contact material for the negative electrode that is brought into contact with the n-type contact layer, Cr, W, V or the like can be used in addition to Al, Ti, Ni, Au, or the like. It is needless to say that the bonding property can be provided by employing the multi-layer structure to the overall negative electrode. Covering the outermost surface with Au is particularly preferable, since it makes it easy to carry out bonding.

Known positive electrodes having various compositions and structures can be used as a positive electrode without imposing any limitation.

Transparent materials for the positive electrode may include Pt, Pd, Au, Cr, Ni, Cu, Co, or the like. Further, it has been known that the transparency is enhanced by employing the structure in which a part thereof is oxidized. Reflective materials for the positive electrode may include Rh, Ag, Al, or the like in addition to the aforesaid materials.

The electrode can be formed from a conductive oxide containing no metal. The transparent electrode made of a conductive oxide such as ITO is desirable since it can reduce the contact resistance.

In order to divide the nitride semiconductor (wafer) stacked on the substrate into each light-emitting device and to tilt the side face of the semiconductor layer with respect to the normal line of the major surface of the substrate, a resist pattern is firstly formed so as to cover the positive electrode, negative electrode and exposed p-type layer. The resist may be a positive type or negative type. Lithography is performed in accordance with a general procedure with the use of a photomask having a suitable pattern so as to expose the interface of the individual light-emitting device including the positive electrode and negative electrode. Alternatively, the lithography is not always needed if the resist covers the aforesaid electrodes and p-type layer and each device can be discriminated. The thickness is preferably 0.1 µm to 20 µm. When the thickness is small, the film is likely to be peeled off upon the wet etching. When the thickness is large, a problem of resolution of the lithography arises or the recognition of the pattern below becomes difficult. The thickness is preferably 0.5 µm to 10 µm, and more preferably 1 µm to 5 µm.

Subsequently, the nitride semiconductor layer is removed from the substrate along the outer shape of each light-emitting device. The removal is desirably performed with the use of laser. The processed position is limited to the laser irradiation position by selecting laser having a wavelength shorter than that at the absorption end of the nitride semiconductor, due to high absorption coefficient as high as $10^5$ cm$^{-1}$ of the nitride semiconductor. The appropriate selection of a laser optical system makes it possible to process to a width of less than 10 µm, whereby the device yield can be enhanced. The depth of the substrate by the laser processing can be selected within the range of 10 µm or more at will. When the processed depth is small, a poor shape is likely to be produced in the later-performed dividing process. When the processed depth is 10 µm or more, the generation of defects can be reduced, and a depth of 20 µm or more is further desirable.

A mechanical dicer can also be employed. In this case, a blade used for cutting is suitably selected to reduce the cutting amount as much as possible in order to reduce the cracking or breaking of the device. The cutting amount is preferably within the range of 1 µm to 50 µm, more preferably 1 µm to 20 µm, and most preferably 1 µm to 10 µm.

Next, wet etching is performed on the formed groove portion to form a concave portion (split groove). The wet etching is carried out with the use of orthophosphoric acid. The orthophosphoric acid is added to a beaker housed in a prescribed heating device, and heated to 100° C. to 400° C. When the heating temperature is low, the etching speed is slow, while when the heating temperature is too high, mask peeling occurs. The desirable heating temperature of 150 to 300° C., i.e., a more desirable heating temperature of 180 to 240° C. can provide both a sufficient etching speed and peeling resistance.

The angle of the etched side face varies depending upon the dislocation density present in the nitride semiconductor layer. When the dislocation density is high, the etching rate in the plane direction becomes high, and when the dislocation density is low, the etching rate in the plane direction becomes low. Accordingly, when the dislocation density present in the nitride semiconductor layer is gradually decreased from the surface of the substrate, the side face formed by the etching can easily be tilted toward the substrate as shown in FIG. 1. On the contrary, when the dislocation density present in the nitride semiconductor layer is gradually increased from the surface of the substrate, the side face formed by the etching can easily be tilted toward the surface of the nitride semiconductor layer as shown in FIG. 2. Further, the tilt surface can be controlled to have plural tilt angles by varying the rate of change of the distribution of the dislocation density in the nitride semiconductor layer in the direction vertical to the substrate.

Finally, the wafer is divided into each light-emitting device along the formed concave portion (split groove).

When the groove is formed on the surface of the nitride semiconductor layer on the surface of each light-emitting device where the electrode is not formed, the removal is performed at the desired position to the desired depth during the aforesaid process of removing the nitride semiconductor layer with a laser or the like, and then, the next wet etching process may be carried out. The nitride semiconductor layer may naturally be removed to a depth and a width equal to those of the split groove.

EXAMPLES

Example 1

Figure 7:
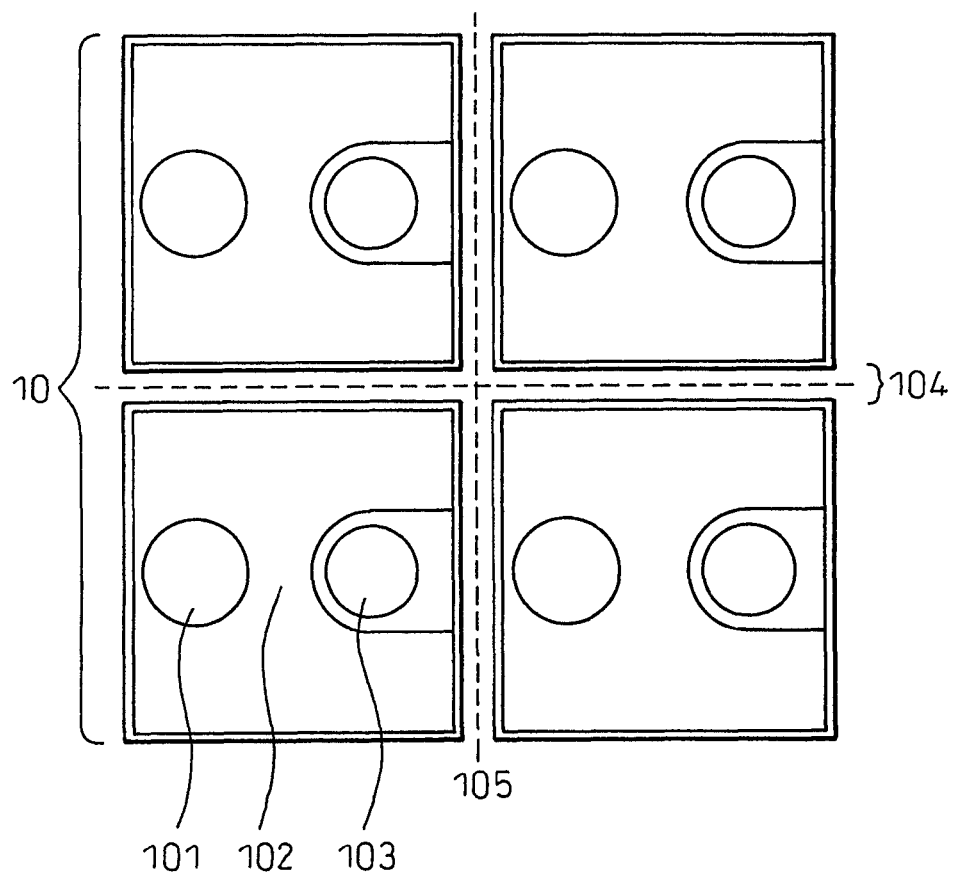
FIG. 7 is a schematic plan view of a wafer of the nitride semiconductor light-emitting device manufactured in an example 1.

The examples according to the present invention will be explained hereinafter. FIG. 7 shows a schematic plan view of a wafer of a light-emitting device manufactured in this example. In the figure, numeral 10 denotes an aggregate (wafer) of a light-emitting device, 101 denotes a positive electrode pad, 102 denotes a transparent positive electrode, 103 denotes a negative electrode, 104 denotes a boundary of the individual light-emitting device, and 105 denotes a line for removing the nitride semiconductor layer.

A sapphire ($Al_2O_3$) C-surface substrate was used as a substrate, and stacked successively thereon through an AlN buffer layer formed in accordance with the method disclosed in the Japanese Unexamined Patent Publication No. 2003-243302 were a non-doped GaN layer of 6 µm; n-type contact layer of 4 µm in which Ge was periodically doped to make the average carrier concentration $1\times10^{19}$ $cm^{-3}$; n-type clad layer of 12.5 nm made of $In_{0.1}Ga_{0.9}N$; a light-emitting layer having a multiple quantum well structure in which barrier layer of 16 nm made of GaN and well layer of 2.5 nm made of $In_{0.2}Ga_{0.8}N$ were alternately stacked five times, and then, a barrier layer was finally formed; and a p-type contact layer having a thickness of 0.15 µm and made of Mg-doped (concentration of $8\times10^{19}/cm^3$) $Al_{0.03}Ga_{0.97}N$, thereby forming a nitride semiconductor layer on the substrate.

The nitride semiconductor layer stacked as described above was longitudinally processed into a thin-film shape and observed by a transmission electron microscope. As a result, the dislocation density in the nitride semiconductor layer decreased toward the growing direction of the semiconductor layer with a ratio of 100 $cm^{-2}$ per a thickness of 1.0 µm in the direction vertical to the substrate.

With the use of a known lithography and RIE, the n-type contact layer at the boundary portion between the individual devices and the portion where the negative electrode is to be formed are exposed on the surface of the nitride semiconductor layer.

A transparent positive electrode made of Pt and Au was formed successively from the p-type contact layer at the predetermined position on the p-type contact layer of the nitride semiconductor layer by using a known lithography and lift-off method. Subsequently, the positive electrode for bonding was formed on the transparent positive electrode by a known lithography and lift-off method. Then, a negative electrode made of Cr, Ti and Au was formed successively from the n-type contact layer at the portion of the exposed n-type contact layer where the negative electrode was to be formed.

The photoresist used for the lithography was applied on the wafer shown in FIG. 7 in which the electrode forming process to the individual device was completed. Only the boundary portion between the light-emitting devices was exposed again by lithography.

A laser was used as means for removing the nitride semiconductor layer to the substrate. The split groove having the depth of 20 µm to the substrate was formed with a laser having a wavelength of 266 nm, frequency of 50 kHz, output of 1.6 W, and processing speed of 70 mm/second. A stage was rotated at an angle of 90° to form the split groove in the Y-axis direction by the same manner.

The substrate on which the split grooves were formed was dipped into a quartz beaker containing orthophosphoric acid, heated to 180° C. by using a heating device, for 20 minutes to execute wet etching. The etching amount of the nitride semiconductor layer was 5.2 µm. The substrate and the nitride semiconductor layer to which the wet etching was finished was washed by water in an ultrasonic solution, and the etching mask made of the resist was removed by cleaning with organic substance.

The substrate and the nitride semiconductor layer (wafer) after the etching process were further thinned to 80 µm by polishing the substrate and, then, separated into individual light-emitting device by a breaking device. Thus, light-emitting devices of 350 by 350 µm square were manufactured.

When the output of a separated light-emitting device was evaluated by an integrating sphere, it was 8.0 mW when current of 20 mA flowed. Further, observing the side face of the device by an SEM, the side face of the nitride semiconductor layer was tilted with respect to the side face of the sapphire substrate that was vertically cut as shown in FIG. 1, wherein the tilt angle (θ1) of the normal line of the side face of the nitride semiconductor layer to the normal line of the major surface of the substrate was 130 degrees.

Example 2

An example of the present invention in which a condition is changed will be explained.

During the growth of the nitride semiconductor layer on the substrate, the growing temperature was increased to more than that in the example 1 by 50° C., whereby the dislocation density in the nitride semiconductor layer was decreased toward the growing direction of the semiconductor with the ratio of 10 $cm^{-2}$ per a thickness of 1.0 µm in the direction vertical to the substrate. The other conditions were the same as those in the example 1. Although the distribution of the dislocation density was controlled by changing the growing temperature in this example, the distribution of the dislocation density can similarly be controlled by changing various conditions such as the ratio of supply amount of material, growing speed, growing pressure, or the like. The formation of the electrode, removal of the nitride semiconductor layer, separation of device and evaluation performed later were carried out by the same manner as in Example 1.

When the output of the separated device was evaluated, it was 7.0 mW. The tilt angle (81) of the normal line of the side face of the formed nitride semiconductor layer to the normal line of the major surface of the substrate was 110 degrees.

Comparative Example 1

The case where the wet etching is not performed will be shown for comparison.

The nitride semiconductor layer was grown and removed under conditions the same as those in Example 1. After the split groove was formed, the device was separated without performing wet etching. The side face of the substrate of the separated light-emitting device was vertical to the major surface of the substrate.

When the output of the separated light-emitting device was evaluated, it was 5.1 mW. The angle of the side face of the nitride semiconductor layer of the device had a normal line generally equal to the normal line of the side face of the substrate that was vertically cut.

Example 3

Figure 8:
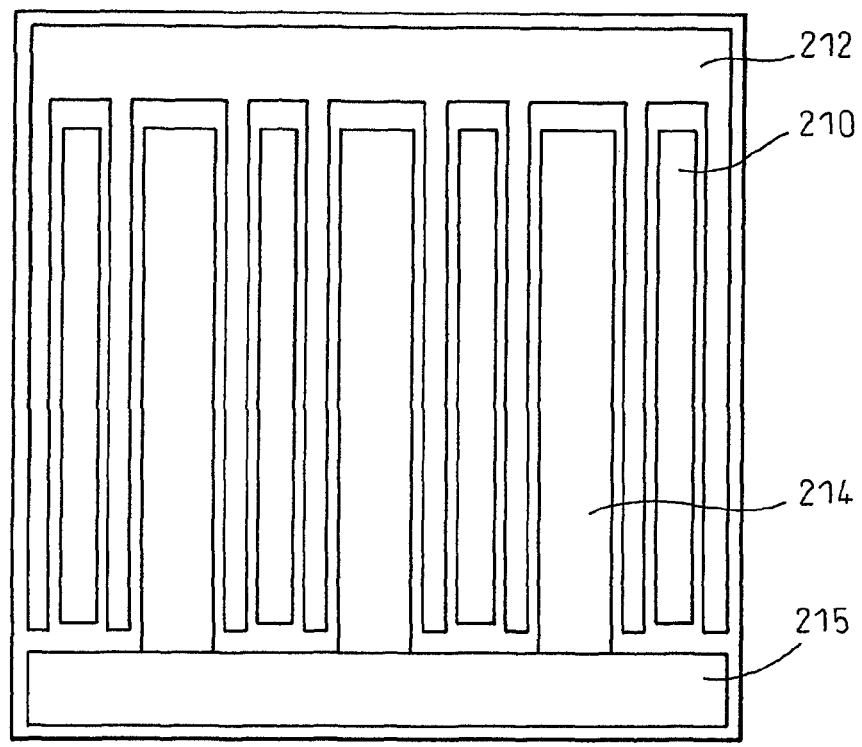
FIG. 8 is a schematic plan view of the nitride semiconductor light-emitting device manufactured in example 3.

An example according to the present invention will be shown hereinafter. In this example, as shown in FIG. 8, a light-emitting device having four grooves on the plane of 1 by 1 millimeters square was manufactured. In the figure, 210 is a groove, 212 is a negative electrode, 214 is a transparent positive electrode, and 215 is a positive electrode pad.

A sapphire ($Al_2O_3$) C-surface substrate was used for the substrate, and a nitride semiconductor layer was formed under conditions the same as those in Example 2.

With the use of known lithography and RIE, the n-type contact layer at the four grooves on the surface of the light-emitting device, boundary portion of the individual light-emitting device and the portion where the negative electrode was to be formed were exposed on the surface of the nitride semiconductor layer.

A transparent positive electrode made of ITO was formed at the predetermined position on the p-type contact layer of the nitride semiconductor layer by using a known lithography and lift-off method. Subsequently, the positive-electrode pad for bonding was formed on the transparent positive electrode by a known lithography and lift-off method. Then, a negative electrode made of Cr, Ti and Au was formed successively from the n-type contact layer at the portion of the exposed n-type contact layer where the negative electrode was to be formed.

The photoresist used for the lithography was applied on the wafer, shown in FIG. 8, in which the electrode forming process to the individual light-emitting device was completed and many light-emitting devices were formed. The portion where the groove on the surface of the light-emitting device was formed and the boundary portion between the individual light-emitting devices were exposed again by the lithography.

A laser was used as means for removing the nitride semiconductor layer for forming the groove and the split groove. The groove and the split groove having the depth of 20 μm to the substrate were formed with the laser having a wavelength of 266 nm, frequency of 50 kHz, output of 1.6 W, and processing speed of 70 mm/second. Through the control of the laser flashing and the moving speed of a stage, the groove on the surface of the light-emitting device and the split groove at the boundary portion between the individual light-emitting devices could be formed at the desired position.

In order to tilt the side faces of the groove and the split groove, the substrate on which the groove and split groove were formed was dipped into a quartz beaker containing orthophosphoric acid, heated to 180° C. by using a heating device, for 20 minutes to execute wet etching. The etching amount of the nitride semiconductor layer was 5.2 μm. The substrate and the nitride semiconductor layer to which the wet etching was finished was washed by water in an ultrasonic solution, and the etching mask made of the resist was removed by cleaning with organic substance.

The substrate and the nitride semiconductor layer after the etching process were further made to be 80 μm by polishing the substrate and, then, were separated into individual light-emitting devices by a breaking device.

When the output of the separated light-emitting device was evaluated by an integrating sphere, it was 200 mW for an energization of 350 mA. Further, when the sectional shape was formed and the side faces of the groove and the split groove were observed by an SEM, the tilt angle (θ1) shown in FIG. 1 made by the normal line of the side face of the nitride semiconductor layer and the normal line of the major surface of the substrate was 100 degrees.

Example 4

Figure 9:
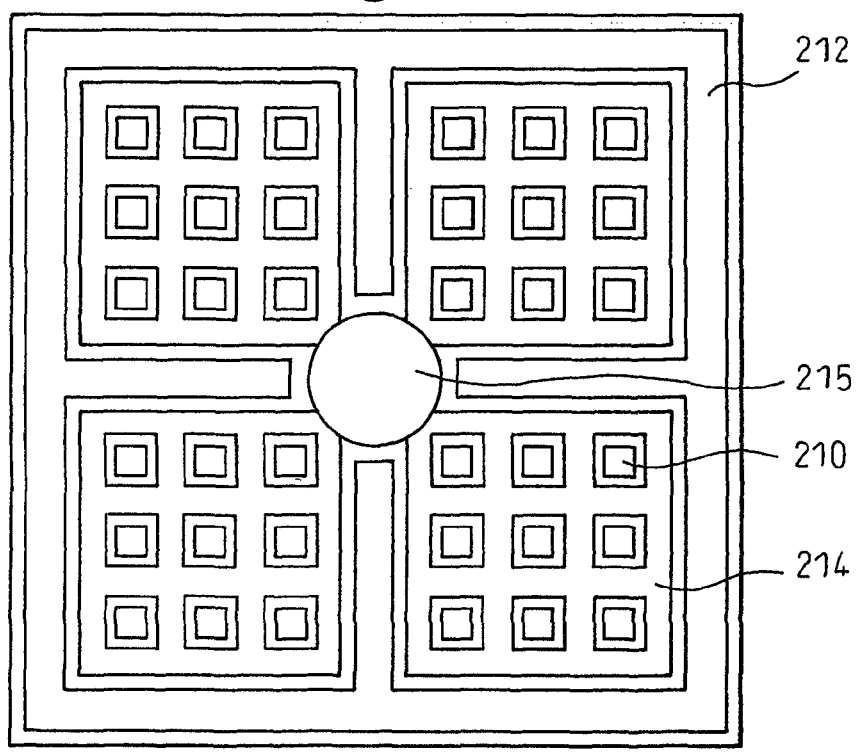
FIG. 9 is a schematic plan view of the nitride semiconductor light-emitting device manufactured in example 4.

A light-emitting device was manufactured by the same manner as in Example 3 except that the plane shape of the light-emitting device had a pattern shown in FIG. 9. In the figure, 210 is a groove, 212 is a negative electrode, 214 is a transparent positive electrode, and 215 is a positive electrode pad.

When the output of the individual separated light-emitting device was evaluated by an integrating sphere, it was 220 mW for an energization of 350 mA. Further, when the sectional shape was formed and the side faces of the groove and the split groove were observed by an SEM, the tilt angle (θ1) shown in FIG. 1 made by the normal line of the side face of the nitride semiconductor layer and the normal line of the major surface of the substrate was 110 degrees.

Comparative Example 2

A case where the wet etching is not performed will be shown for comparison.

The nitride semiconductor layer was grown and removed under conditions the same as those in Example 3.

After the groove and the split groove were formed, the device was separated without performing wet etching. The side faces of the groove and the split groove of the separated device was vertical to the major surface of the substrate.

When the output of the separated device was evaluated, it was 120 mW for the energization by a current amount the same as that in Example 3. The angle of the side face of the nitride semiconductor layer of the device had the normal line generally equal to the normal line of the side face of the substrate that was vertically cut.

Example 5 to 10

Figure 10:
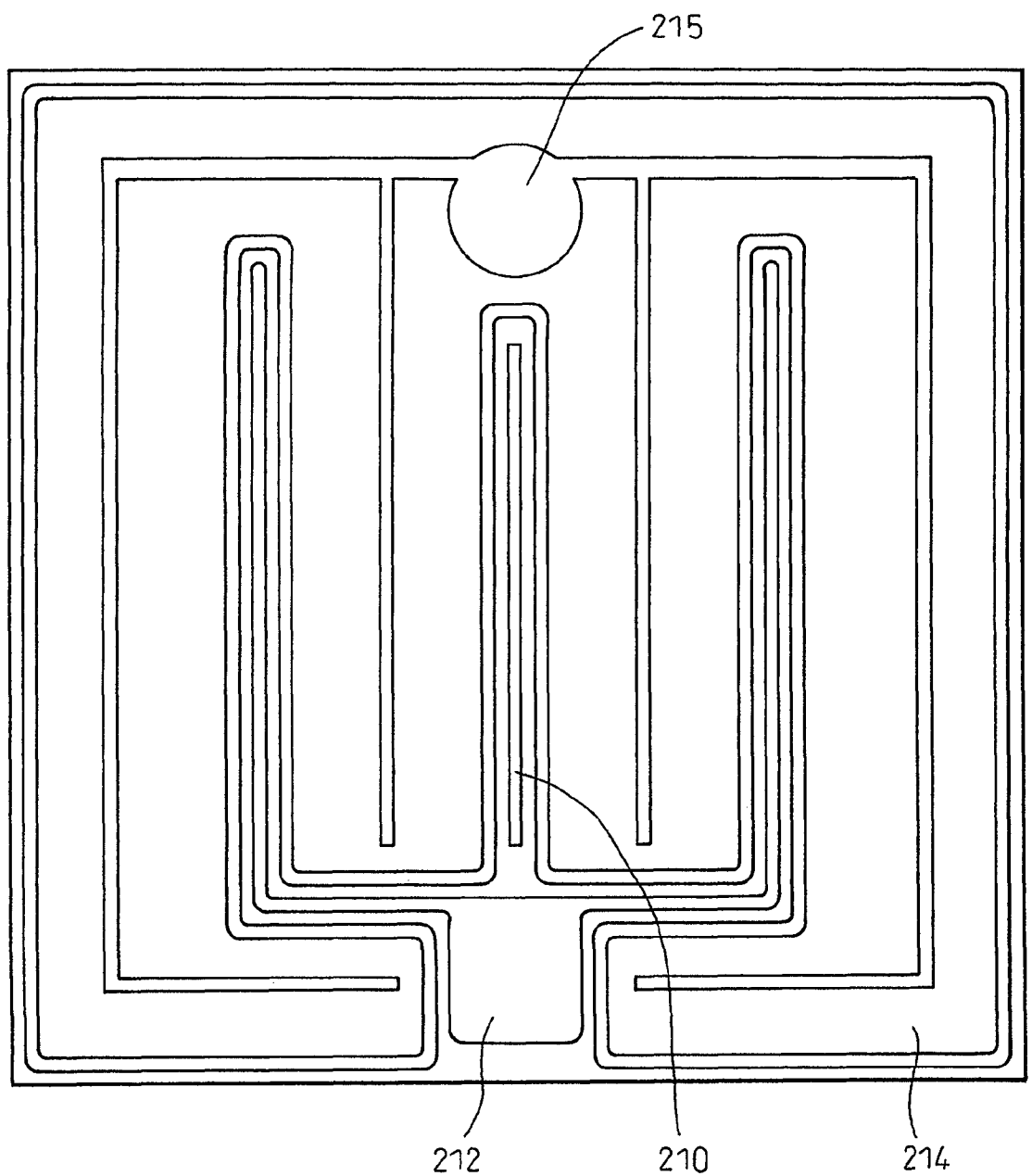
FIG. 10 is a schematic plan view of the nitride semiconductor light-emitting device manufactured in example 5.
Figure 11:
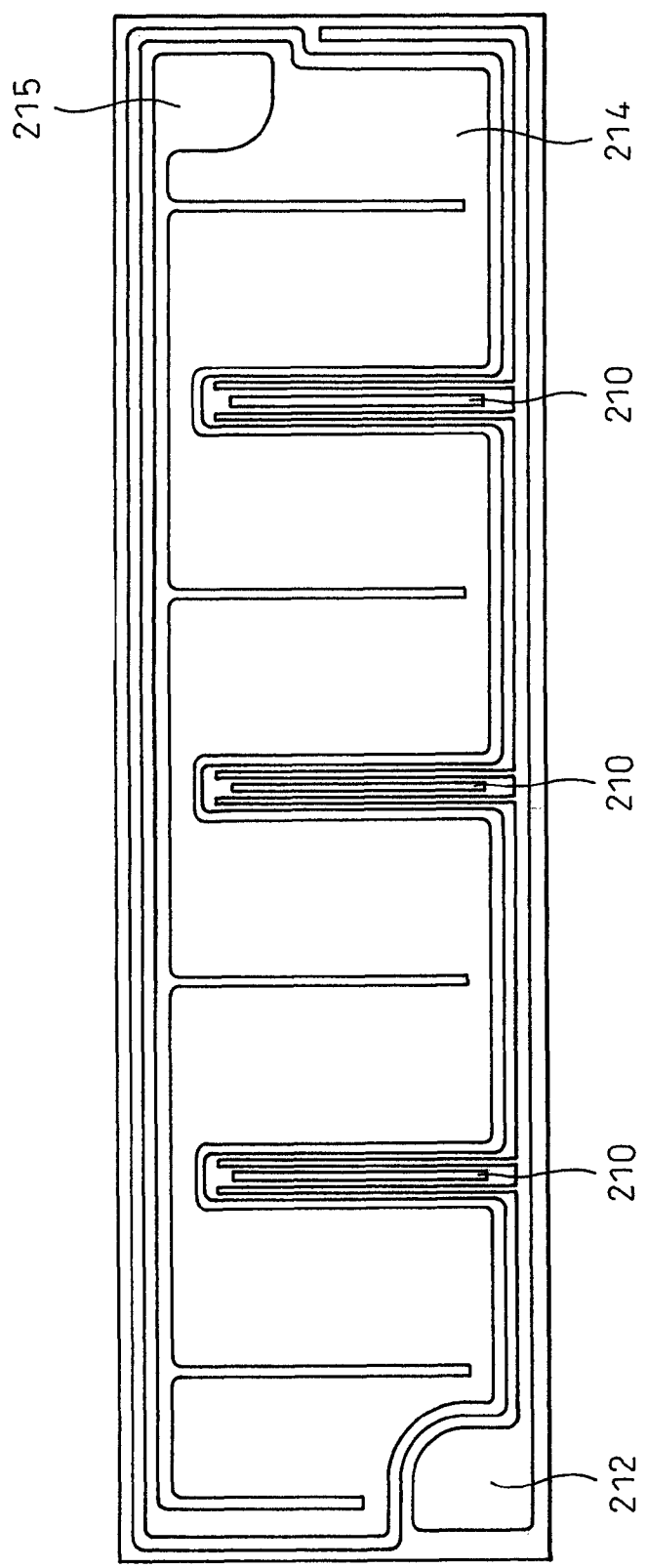
FIG. 11 is a schematic plan view of the nitride semiconductor light-emitting device manufactured in example 7.

In these examples, nitride semiconductor light-emitting devices having a various shape were manufactured and the characteristics were compared. In a design of a chip, the chip having a quadruple area compared with a chip having one side of 350 μm was aimed. Each of FIGS. 10, 11 and 12 shows a schematic plan view of a light-emitting device manufactured in example 5, 7 and 9, respectively. In these figures, 210 is a groove, 212 is a negative electrode, 214 is a transparent positive electrode, and 215 is a positive electrode pad. Each of examples 6, 8 and 10 was the same as each of examples 5, 7 and 9, respectively, except that a groove 210 was not formed.

A nitride semiconductor stacked structure was produced as follows. A sapphire ($Al_2O_3$) C-surface substrate was used as a substrate, and stacked successively thereon through an AlN buffer layer formed in accordance with the method disclosed in the Japanese Unexamined Patent Publication No. 2003-243302 were a non-doped GaN layer of 6 μm; n-type contact layer of 2 μm in which Si was doped to make the average carrier concentration $1\times10^{19}$ cm$^{-3}$; n-type clad layer of 12.5 nm made of Si-doped In$_{0.1}$Ga$_{0.9}$N; a light-emitting layer having a multiple quantum well structure in which barrier layer of 16 nm made of GaN and well layer of 2.5 nm made of In$_{0.2}$Ga$_{0.8}$N were alternately stacked five times, and then, a barrier layer was finally formed; a p-type clad layer having a thickness of 20 nm and made of Mg-doped (concentration of $1\times10^{20}$/cm$^3$) Al$_{0.08}$Ga$_{0.92}$N; and a p-type contact layer having a thickness of 0.2 μm and made of Mg-doped (concentration of $8\times10^{19}$/cm$^3$) Al$_{0.03}$Ga$_{0.97}$N, thereby forming a nitride semiconductor layer on the substrate.

A positive electrode, a negative electrode, grooves and split grooves were formed on the obtained nitride semiconductor stacked structure and then the each light-emitting device was separated, by the same procedures as in Example 3.

The obtained light-emitting device was evaluated by the same manner as in Example 3 and the results were shown in Table 1. When each of examples 5, 7 and 9 was compared with each of examples 6, 8 and 10, respectively, it was found that the output was increased by about 5% when the groove was formed.

TABLE 1

|  | plane shape of chip | chip size | groove | θ1 | current (mA) | driving voltage (V) | output (mW) |
| --- | --- | --- | --- | --- | --- | --- | --- |
| Example 5 | FIG. 10 | 700 × 700 μm | present | 110° | 200 | 3.50 | 83.5 |
| Example 6 | FIG. 10 | 700 × 700 μm | none | 110° | 200 | 3.44 | 79.2 |
| Example 7 | FIG. 11 | 350 × 1400 μm | present | 110° | 200 | 3.81 | 91.7 |
| Example 8 | FIG. 11 | 350 × 1400 μm | none | 110° | 200 | 3.80 | 86.8 |
| Example 9 | FIG. 12 | 350 × 1400 μm | present | 110° | 200 | 3.55 | 86.3 |
| Example 10 | FIG. 12 | 350 × 1400 μm | none | 110° | 200 | 3.58 | 80.7 |

INDUSTRIAL APPLICABILITY

Since the damage is small in the processing of split groove and the light extraction efficiency is high, the nitride semiconductor light-emitting device according to the present invention can be utilized as a high-intensity light-emitting diode.

Since the damage is small in the processing of a split groove, and the controllability of the later-performed etching process is enhanced by changing the growing conditions upon growing the nitride semiconductor layer to easily optimize the light extraction efficiency, the nitride semiconductor light-emitting device according to the present invention can prevent a reduction in yield whereby it can be utilized as a high-intensity light-emitting diode.

The invention claimed is:

1. A Group III nitride semiconductor light-emitting device comprising:
a substrate; and
a Group III nitride semiconductor layer including a light-emitting layer, stacked on the substrate, wherein the side face of the Group III nitride semiconductor layer is tilted with respect to the normal line of the major surface of the substrate,
wherein a cross-section of the Group III nitride semiconductor layer is tilted so as to be narrower toward the substrate, and a dislocation density in the Group III nitride semiconductor layer decreases from the substrate toward a growing direction of the semiconductor layer in the direction vertical to the substrate and the decreased amount is in a range of 10 cm$^{-2}$ to 10000 cm$^{-2}$ per thickness of 1.0 μm in the direction vertical to the substrate, a groove is formed on the Group III nitride semiconductor layer at the region of the surface of the light-emitting device where an electrode is not formed, electrodes having the same polarity are formed on both sides of the groove, and another electrode having a polarity opposite to the polarity of the electrodes on both sides of the groove is formed at an outside of the electrodes on both sides of the groove.

2. A Group III nitride semiconductor light-emitting device according to claim 1, wherein a groove is formed on the Group III nitride semiconductor layer at the region of the surface of the light-emitting device where an electrode is not formed, and the normal line of the side face of the groove is not vertical to the normal line of the major surface of the substrate.

3. A Group III nitride semiconductor light-emitting device according to claim 1, wherein the angle θ1 made by the normal line of the side face of the Group III nitride semiconductor layer and the normal line of the major surface of the substrate is 100 degrees or more and 175 degrees or less.

4. A Group III nitride semiconductor light-emitting device according to claim 3, wherein the angle θ1 made by the normal line of the side face of the Group III nitride semiconductor layer and the normal line of the major surface of the substrate is 110 degrees or more and 170 degrees or less.

5. A Group III nitride semiconductor light-emitting device according to claim 4, wherein the angle θ1 made by the normal line of the side face of the Group III nitride semiconductor layer and the normal line of the major surface of the substrate is 120 degrees or more and 160 degrees or less.

6. A Group III nitride semiconductor light-emitting device according to claim 1, wherein the dislocation density in the Group III nitride semiconductor layer decreases from the substrate toward the growing direction of the semiconductor layer and the decreased amount is in a range of 100 cm$^{-2}$ to 1000 cm$^{-2}$ per thickness of 1.0 μm in the direction vertical to the substrate.

7. A Group III nitride semiconductor light-emitting device comprising:
a substrate; and
a Group III nitride semiconductor layer including a light-emitting layer, stacked on the substrate, wherein a side face of the Group III nitride semiconductor layer is tilted with respect to the normal line of the major surface of the substrate,
wherein a cross-section of the Group III nitride semiconductor layer is tilted so as to be wider toward the substrate, and a dislocation density in the Group III nitride semiconductor layer increases from the substrate toward a growing direction of the semiconductor layer in the direction vertical to the substrate and the increased amount is in a range of 10 cm$^{-2}$ to 10,000 cm$^{-2}$ per thickness of 1.0 μm in the direction vertical to the substrate, a groove is formed on the Group III nitride semiconductor layer at the region of the surface of the light-emitting device where an electrode is not formed, electrodes having the same polarity are formed on both sides of the groove, and another electrode having a polarity opposite to the polarity of the electrodes on both sides of the groove is formed at an outside of the electrodes on both sides of the groove.

8. A Group III nitride semiconductor light-emitting device according to claim 7, wherein the angle θ2 made by the normal line of the side face of the Group III nitride semiconductor layer and the normal line of the major surface of the substrate is 5 degrees or more and 80 degrees or less.

9. A Group III nitride semiconductor light-emitting device according to claim 8, wherein the angle θ2 made by the normal line of the side face of the Group III nitride semiconductor layer and the normal line of the major surface of the substrate is 10 degrees or more and 70 degrees or less.

10. A Group III nitride semiconductor light-emitting device according to claim 9, wherein the angle θ2 made by the normal line of the side face of the Group III nitride semiconductor layer and the normal line of the major surface of the substrate is 20 degrees or more and 60 degrees or less.

11. A Group III nitride semiconductor light-emitting device according to claim 7, wherein the dislocation density in the Group III nitride semiconductor layer increases from the substrate toward the growing direction of the semiconductor layer and the increased amount is in a range of 100 $cm^{-2}$ to 1,000 $cm^{-2}$ per thickness of 1.0 μm in the direction vertical to the substrate.

12. A Group III nitride semiconductor light-emitting device according to claim 1, wherein the groove is formed at two or more positions.

13. A Group III nitride semiconductor light-emitting device according to claim 1, wherein the groove has a depth piercing through the light-emitting layer.

14. A Group III nitride semiconductor light-emitting device according to claim 1, wherein the area of the groove at the surface is 3 to 50% of the surface area of the light-emitting device including the electrode surface.

15. A Group III nitride semiconductor light-emitting device according to claim 2, wherein the length of one side of the light-emitting device at the surface is 500 μM or more.

16. A Group III nitride semiconductor light-emitting device according to claim 1, wherein the substrate is made of sapphire ($Al_2O_3$).

17. A Group III nitride semiconductor light-emitting device according to claim 1, wherein the substrate is made of silicon carbide (SiC).

18. A Group III nitride semiconductor light-emitting device according to claim 1, wherein the substrate is made of silicon (Si).

19. A method of fabricating a Group III nitride semiconductor light-emitting device comprising a substrate and a Group III nitride semiconductor layer including a light-emitting layer, stacked on the substrate, wherein the side face of the Group III nitride semiconductor layer is tilted with respect to the normal line of the major surface of the substrate,
wherein a cross-section of the Group III nitride semiconductor layer is tilted so as to be narrower toward the substrate, and a dislocation density in the Group III nitride semiconductor layer decreases from the substrate toward a growing direction of the semiconductor layer in the direction vertical to the substrate and the decreased amount is in a range of 10 $cm^{-2}$ to 10000 $cm^{-2}$ per thickness of 1.0 μm in the direction vertical to the substrate, a groove is formed on the Group III nitride semiconductor layer at the region of the surface of the light-emitting device where an electrode is not formed, electrodes having the same polarity are formed on both sides of the groove, and another electrode having a polarity opposite to the polarity of the electrodes on both sides of the groove is formed at an outside of the electrodes on both sides of the groove,
said method comprising: a step of stacking the Group III nitride semiconductor layer on the substrate; a step of covering the surface of the Group III nitride semiconductor layer with a mask having a predetermined pattern; a step of removing the Group III nitride semiconductor layer to the substrate at the section for dividing into each device; a step of wet-etching the Group III nitride semiconductor layer after the removal; and a step of dividing into devices, wherein, in the step of stacking the Group III nitride semiconductor layer, a distribution of dislocation density is formed in the Group III nitride semiconductor layer in the direction vertical to the substrate so as to provide a distribution in the etching speed in the later-performed wet-etching process.

20. A method of fabricating a Group III nitride semiconductor light-emitting device according to claim 19, wherein, in the step of stacking the Group III nitride semiconductor layer, the dislocation density is decreased or increased from the substrate toward the growing direction of the semiconductor layer.

21. A method of fabricating a Group III nitride semiconductor light-emitting device according to claim 19, wherein the mask is a photoresist.

22. A method of fabricating a Group III nitride semiconductor light-emitting device according to claim 19, wherein the step of removing the Group III nitride semiconductor layer is performed with the use of a laser.

23. A method of fabricating a Group III nitride semiconductor light-emitting device according to claim 19, wherein the step of removing the Group III nitride semiconductor layer is performed with the use of a dicer.

24. A method of fabricating a Group III nitride semiconductor light-emitting device according to claim 19, wherein the wet-etching process is performed with the use of orthophosphoric acid.

25. A Group III nitride semiconductor light-emitting device according to claim 7, wherein a groove is formed on the Group III nitride semiconductor layer at the region of the surface of the light-emitting device where an electrode is not formed, and the normal line of the side face of the groove is not vertical to the normal line of the major surface of the substrate.

* * * * *